United States Patent
Simony et al.

(10) Patent No.: US 12,356,101 B2
(45) Date of Patent: Jul. 8, 2025

(54) IMAGE SENSOR WITH A CONTROL CIRCUIT

(71) Applicants: STMicroelectronics (Grenoble 2) SAS, Grenoble (FR); STMicroelectronics (Crolles 2) SAS, Crolles (FR)

(72) Inventors: Laurent Simony, Grenoble (FR); Frederic Lalanne, Bernin (FR)

(73) Assignees: STMicroelectronics (Grenoble 2) SAS, Grenoble (FR); STMicroelectronics (Crolles 2) SAS, Crolles (FR)

(*) Notice: Subject to any disclaimer, the term of this patent is extended or adjusted under 35 U.S.C. 154(b) by 429 days.

(21) Appl. No.: 17/885,960

(22) Filed: Aug. 11, 2022

(65) Prior Publication Data

US 2023/0071932 A1 Mar. 9, 2023

(30) Foreign Application Priority Data

Aug. 31, 2021 (FR) ...................................... 2109100

(51) Int. Cl.
*H04N 25/76* (2023.01)
*H04N 25/532* (2023.01)
(Continued)

(52) U.S. Cl.
CPC ....... *H04N 25/7795* (2023.01); *H04N 25/532* (2023.01); *H04N 25/63* (2023.01); *H04N 25/745* (2023.01); *H04N 25/771* (2023.01); *H04N 25/779* (2023.01); *H10F 39/8023* (2025.01); *H10F 39/80373* (2025.01); *H10F 39/812* (2025.01); *H04N 25/77* (2023.01)

(58) Field of Classification Search
CPC .. H04N 25/7795; H04N 25/532; H04N 25/63; H04N 25/745; H04N 25/771; H04N 25/779; H04N 25/77; H01L 27/14605; H01L 27/14614; H01L 27/14638; H01L 27/14634; H01L 27/14612; H10F 39/8023; H10F 39/80373; H10F 39/812
See application file for complete search history.

(56) References Cited

U.S. PATENT DOCUMENTS

2010/0194936 A1 8/2010 Kanbe
2013/0135486 A1 5/2013 Wan
(Continued)

FOREIGN PATENT DOCUMENTS

CN 1708976 A 12/2005
CN 106105181 A 11/2016
(Continued)

OTHER PUBLICATIONS

CN First Office Action and Search Report for counterpart CN Appl. No. 202211057757.5, report dated Oct. 24, 2024, 7 pgs.
(Continued)

*Primary Examiner* — Jennifer D Bennett
(74) *Attorney, Agent, or Firm* — Crowe & Dunlevy LLC

(57) ABSTRACT

An image sensor includes an array of pixels inside and on top of a substrate. A control circuit is configured to apply voltage potentials to the substrate. During a first phase, the control circuit applies a ground potential to the substrate. During a second phase, the control circuit applies a potential positive with respect to the ground potential to the substrate.

12 Claims, 5 Drawing Sheets

(51) Int. Cl.
*H04N 25/63* (2023.01)
*H04N 25/71* (2023.01)
*H04N 25/77* (2023.01)
*H04N 25/771* (2023.01)
*H04N 25/779* (2023.01)
*H10F 39/00* (2025.01)

(56) References Cited

U.S. PATENT DOCUMENTS

| | | | |
|---|---|---|---|
| 2014/0022427 A1* | 1/2014 | Goto | H04N 25/44 |
| | | | 348/308 |
| 2019/0157323 A1* | 5/2019 | Ogi | H01L 27/1463 |
| 2020/0335538 A1 | 10/2020 | Do et al. | |

FOREIGN PATENT DOCUMENTS

| | | |
|---|---|---|
| CN | 107852473 A | 3/2018 |
| CN | 108605103 A | 9/2018 |
| CN | 110557583 A | 12/2019 |

OTHER PUBLICATIONS

INPI Search Report and Written Opinion for priority application, FR 2109100, report dated Jul. 12, 2022, 8 pgs.

\* cited by examiner

IMAGE SENSOR WITH A CONTROL CIRCUIT

PRIORITY CLAIM

This application claims the priority benefit of French Application for Patent No. 2109100, filed on Aug. 31, 2021, the content of which is hereby incorporated by reference in its entirety to the maximum extent allowable by law.

TECHNICAL FIELD

The present disclosure generally concerns sensors and, more particularly, image sensors.

BACKGROUND

Sensors and particularly image sensors are more and more currently used and are standard equipment in many electronic devices such as cell phones (smartphones).

Circuits of image sensor pixels comprise, particularly in the case of global shutter image sensors, one or a plurality of transfer gates enabling to transfer the voltages or charges between storage sites in the pixels. To avoid significant leakage currents during this transfer, it is often desirable to drive the gates with voltages switching between positive and negative levels. The disadvantage of such a driving is that it requires the generation of a high power by the power supply circuit delivering these voltages, in particular for significant switching frequencies. This results in a significant power consumption.

There is a need to improve known image sensors.

SUMMARY

An embodiment overcomes all or part of the disadvantages of known image sensors, in particular image sensors of indirect time of flight and/or global shutter type.

An embodiment provides an image sensor comprising: a pixel array inside and on top of a substrate; and a control circuit configured to apply to the substrate: during a first phase, a ground potential; and during a second phase, a potential positive with respect to the ground potential.

An embodiment provides a method of controlling such an image sensor, the image sensor comprising: a pixel array inside and on top of a substrate; and a control circuit; wherein in the method the control circuit is configured to apply to the substrate: during a first phase, a ground potential; and during a second phase, a potential positive with respect to the ground potential.

According to an embodiment, each pixel comprises: a first area configured to generating charges from a luminous excitation, and at least two assemblies each comprising: a second area configured to storing the charges originating from the first area; and a first transfer gate configured to controlling a charge transfer between the first area and the second area.

According to an embodiment, the control circuit is configured to allow, for each first transfer gate of each assembly of each pixel: a setting to the conductive state of the first transfer gate by applying thereto a third potential, and a setting to the non-conductive state of the first transfer gate by applying thereto a fourth potential smaller than the third potential.

According to an embodiment, the first potential is determined so that the first transfer gate is non-conductive when the first potential is applied to the substrate and the fourth potential is applied to the first transfer gate, the fourth potential being equal to or smaller than the potential of the substrate.

According to an embodiment, the control circuit is configured to lower, between the second phase and the first phase, the fourth potential.

According to an embodiment, each pixel comprises a second circuit coupling the memory assemblies to at least one conductive line, the second circuit comprising a second transfer gate, driven by the control circuit and configured to allowing a transfer of the charges stored at the level of the second areas towards a sense node; the control circuit being configured to lower, between the second phase and the first phase, a fifth potential applied to the second transfer gate, by the value of the first potential.

According to an embodiment, the second circuit comprises: a first transistor having its drain coupled to the first sense node; a second transistor having a control gate coupled to the first node; a third transistor connected between the conductive line and a source of the second transistor, and the control circuit is configured to lower, by the value of the first potential, between the second phase and the first phase: a sixth potential applied to the second transfer gate; and a seventh and an eighth potentials for controlling the first transistor.

According to an embodiment, the control circuit comprises: a fourth PMOS-type transistor configured to being controlled independently from a fifth NMOS-type transistor, the drain of the fourth transistor being coupled to the drain of the fifth transistor at the level of a second node, the source of the fourth transistor being further coupled to a power supply rail; the source of the fifth transistor being further coupled to ground; a first switch connected between the second node and a fourth node; a second switch connected between the ground and the fourth node; a second capacitive element connected between a third node and the fourth node, a voltage source configured to delivering the first potential, the source being connected between the ground and a third switch; the third switch being connected between the voltage source and the third node; a fourth switch connected between the ground and the third node; and the first transfer gate is coupled to the second node.

According to an embodiment, between the second phase and the first phase, the fourth transistor and the fifth transistor are driven so that the fourth transistor is in a non-conductive state and the fifth transistor is in a conductive state; then, the fourth transistor and the fifth transistor are driven independently to be in a non-conductive state; then, the third switch is set to a non-conductive state; then the second switch is set to a non-conductive state; then, the first and fourth switches are set to a conductive state.

According to an embodiment, the first phase and the second phase are alternated in time, and between the first phase and the second phase, the first and fourth switches are set to a non-conductive state; then, the second switch is set to a conductive state; then, the third switch is set to a conductive state; then, the fourth transistor and the fifth transistor are driven to be alternately conductive.

According to an embodiment, the second phase corresponds to a phase of transfer and storage of charges generated by the first area of each pixel in at least one of said second areas of said pixel; and the first phase corresponds to a phase of reading of a state representative of the charges stored at the level of the memory areas.

According to an embodiment, the image sensor is of indirect time-of-flight type.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
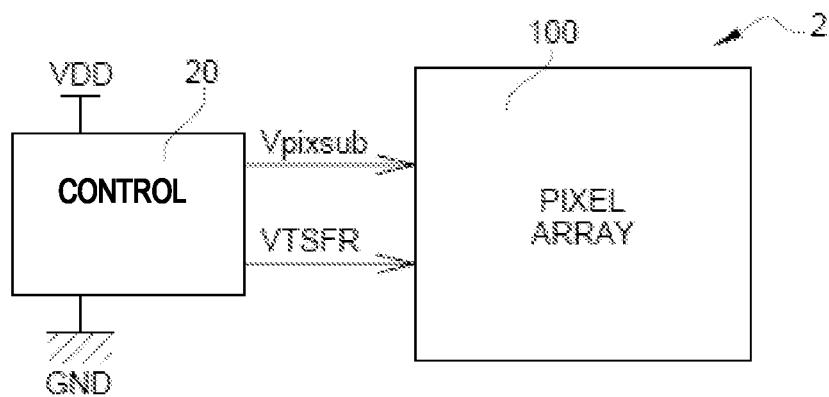
FIG. 1 schematically illustrates an image sensor according to an embodiment of the present description.

FIG. 1 schematically illustrates an image sensor 2 according to an embodiment of the present description. Image sensor 2 comprises a pixel array (PIXEL ARRAY) 100, and a control circuit 20.

Image sensor 2, for example, is a global shutter image sensor. In certain cases, image sensor 2 is a sensor of indirect time of flight ("iToF") type configured to determine an image in relief of a scene to be captured. Each pixel of array 100, for example, comprises one or a plurality of photodiodes.

Control circuit 20 is, for example, powered by a positive power supply voltage rail VDD, and a ground potential rail GND. Control circuit 20 is, for example, configured to deliver control signals to the pixels of array 100. For example, the control circuit is configured to deliver an electric substrate potential Vpixsub and at least one transfer gate control voltage VTSFR. For example, the pixels of array 100 comprise one or a plurality of transfer gates, controlled by the transfer gate control voltage, and allowing the transfer of the voltages or of the charges between storage sites in the pixels. The substrate potential determines a biasing under the transfer gates and also corresponds to the potential of the anodes of the photodiodes.

Figure 2A:
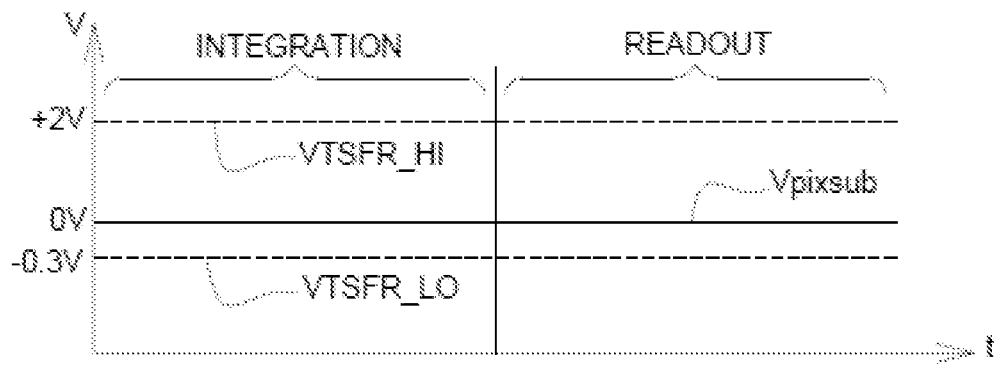
FIG. 2A is a timing diagram showing an example of the drive signals in the image sensor of FIG. 1.

FIG. 2A is a timing diagram showing an example of drive signals, and in particular potential Vpixsub and voltage VTSFR, in the image sensor 2 of FIG. 1, during integration (INTEGRATION) and readout (READOUT) phases. The integration phase is, for example, a phase common for all the pixels of array 100. During the integration phase, electric charges are photogenerated in the pixels by the photodiodes and are, for example, stored in storage sites in the pixels. During the readout phase, signals representative of the photogenerated charges of each pixel are read, for example, row by row.

In the example of FIG. 2A, potential Vpixsub is maintained grounded during the integration and readout phases. Voltage VTSFR is switched between a positive level (VTSFR_HI), for example, of 2 V, and a negative level (VTSFR_LO), for example between −0.3 and −1.3 V, during the integration and readout phases to selectively activate and deactivate the transfer gates of the pixels.

Level VTSFR_LO is, for example, used to deactivate the transfer gates, that is, to maintain them non-conductive. The use of a negative level has the advantage of decreasing the leakage currents of these transfer gates. However, the disadvantage of the generation of positive and negative voltages by control circuit 20 for signal VTSFR is that this circuit is complex, and the power to be supplied by this circuit, as well as the power consumption, risk being high, particularly for significant switching frequencies. This is particularly true for these iToF-type image sensors.

Figure 2B:
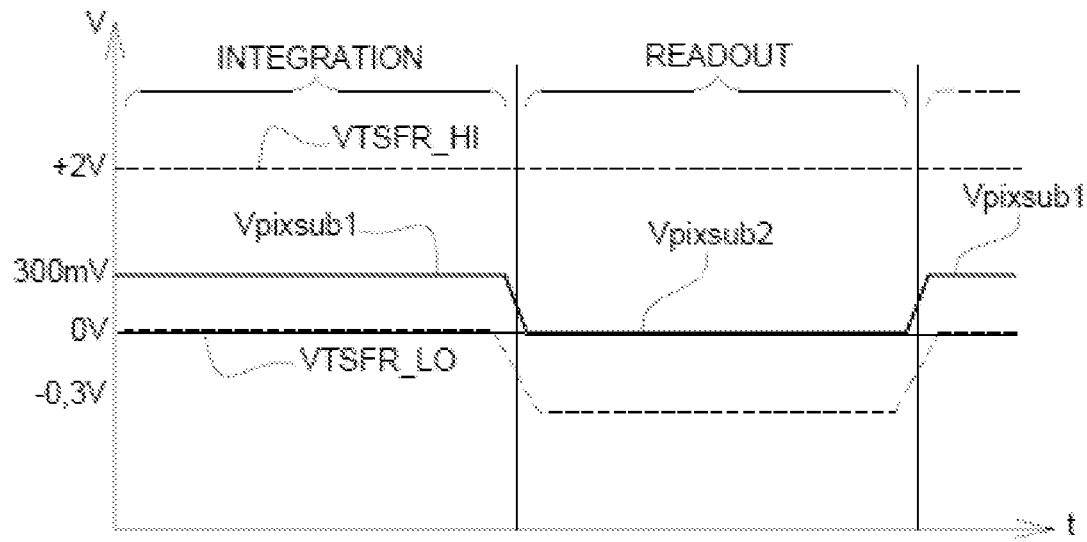
FIG. 2B is a timing diagram showing the drive signals in the image sensor of FIG. 1 according to an embodiment of the present description.

FIG. 2B is a timing diagram showing the drive signals, and in particular potential Vpixsub and voltage VTSFR, in the image sensor 2 of FIG. 1 during integration (INTEGRATION) and readout (READOUT) phases, in the image sensor of FIG. 1 according to an embodiment of the present description.

In the example of FIG. 2B, electric potential Vpixsub is maintained at a positive level Vpixsub1 during the integration phase, and at a level Vpixsub2, smaller than level Vpixsub1, during the readout phase, level Vpixsub2 being, for example, the ground. Voltage VTSFR is switched between a level VTSFR_HI, for example, of 2 V, and a level VTSFR_LO, smaller than level VTSFR_HI, during integration and readout phases. Level VTSFR_LO is, for example, the ground potential during the integration phase. In certain cases, level VTSFR_LO is lower during the readout phase than during the integration phase, for example, is a negative voltage in the range from −0.3 to −1.3 V.

The advantage of using a positive substrate potential during the integration phase is that this enables the low level VTSFR_LO of voltage VTSFR to be at ground (0 V), while ensuring for the transfer gates to be deactivated and thus non-conductive, since voltage VTSFR_LO remains lower than substrate potential Vpixsub1. An advantage of having VTSFR_LO at ground is that it is then no longer necessary for control circuit 20 to be capable of generating a negative power supply. This is particularly advantageous when the switching frequency is high since the power to be supplied is determined by $C \cdot V^2 \cdot f$, where C is the capacitance of the control line, V is the amplitude of the voltage, and f the switching frequency. Switching such a current from a positive power supply to a negative power supply requires using charge pumps which consume a significant energy. Further, substrate potential Vpixsub1 being static during the integration phase, the generation of this positive potential has a limited impact on the power consumption. As concerns the generation of negative voltage VTSFR_LO during the readout phase, in the case where this voltage is used to maintain a non-conductive state of the transfer gate, the power to be supplied is very low, or even zero, allowing a simple solution for the generation of this voltage.

The advantage of using a grounded substrate potential during the readout phase is that this potential is by definition noiseless. If the reference of the signal was Vpixsub1 instead of ground, the reference noise would not be zero, but would in particular be limited by the power supply rejection of this voltage Vpixsub1.

Specific examples of the application of substrate potential levels Vpixsub1 and Vpixsub2 to the pixels of image sensor 2 will now be described in relation with FIGS. 3A and 3B.

Figure 3A:
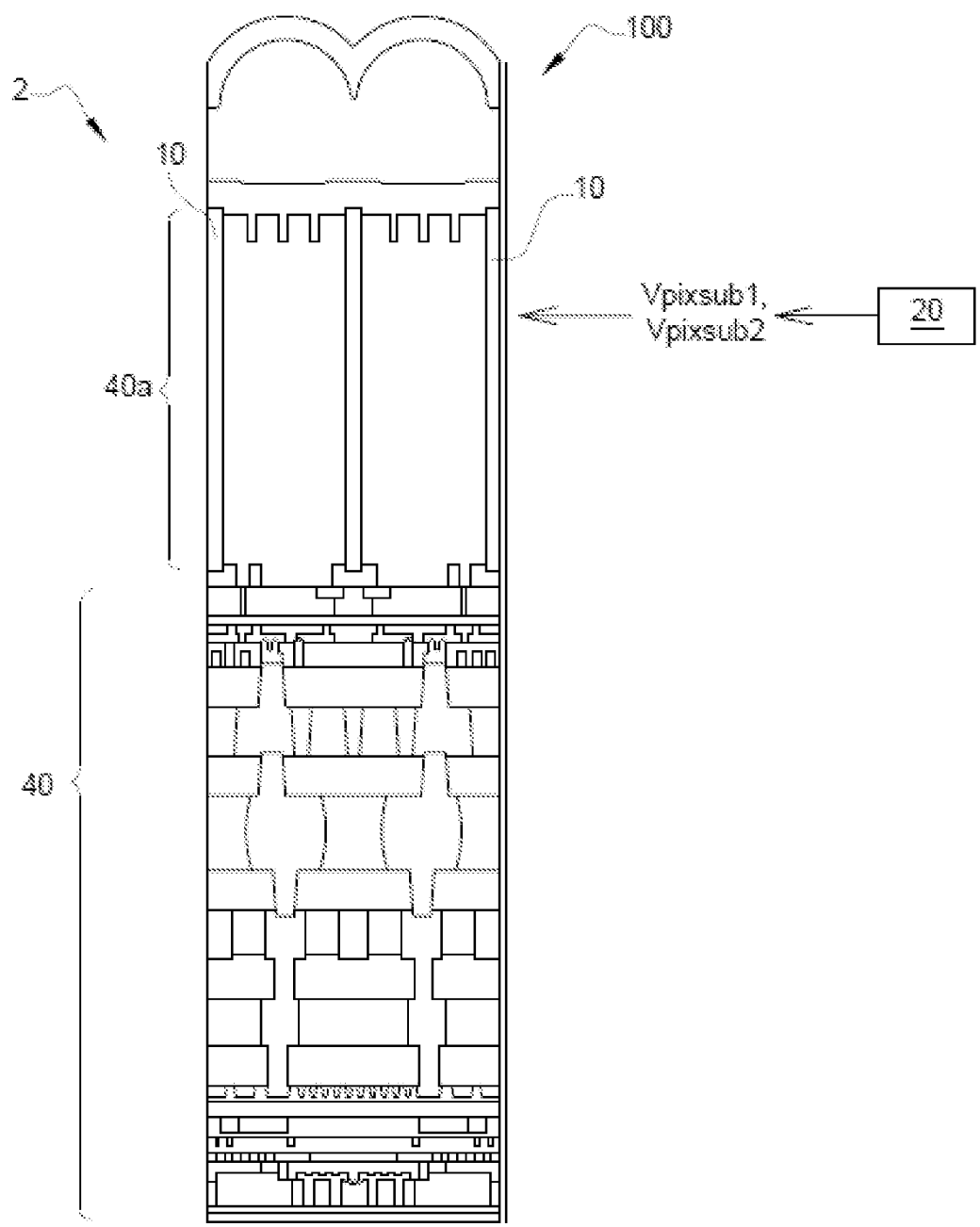
FIG. 3A is a cross-section view of the image sensor of FIG. 1 according to an embodiment of the present description.

FIG. 3A is a cross-section view of the image sensor 2 of FIG. 1 according to an embodiment of the present description.

In FIG. 3A, a substrate 40 and two pixels 10 are seen in cross-section view. In this example, a first region 40a, in other words a first substrate 40a, is bonded, by molecular bonding for example, to substrate 40. An array 100 of pixels 10 of image sensor 2 is arranged inside and on top of the first region 40a of the substrate 40 of image sensor 2. In other words, first region 40a forms a substrate for pixels 10. The rest of substrate 40 may contain a plurality of levels of microelectronic components such as transistors and vias.

First region 40a and substrate 40 are, for example, formed in a semiconductor material, which may be identical or different between first region 40a and the rest of substrate 40.

First region 40a is electrically insulated from the rest of substrate 40, for example, with an insulator layer. It is thus possible for a different electric potential to exist at the level of first region 40a and at the level of the rest of substrate 40.

The control circuit 20 of image sensor 2 enables to apply to first region 40a, during the integration phase, electric potential Vpixsub1, which is, for example, positive with respect to the potential applied to substrate 40. The potential applied to substrate 40 may be equal to ground (GND). During the readout phase, the control circuit 20 of image sensor 2 enables to apply, to first region 40a, electric potential Vpixsub2, which is, for example, equal to the ground potential (GND) of substrate 40. In an example, substrate 40 contains control circuit 20.

Figure 3B:
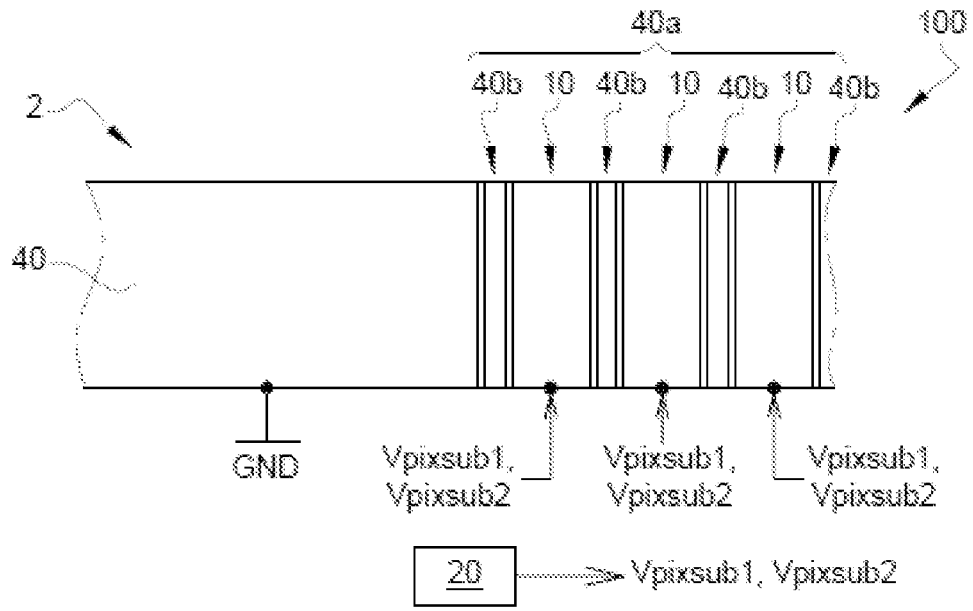
FIG. 3B is a cross-section view of the image sensor of FIG. 1 according to another embodiment of the present description.

FIG. 3B is a cross-section view of the image sensor 2 of FIG. 1 according to another embodiment of the present description.

In FIG. 3B, substrate 40 and three pixels 10 are seen in cross-section view

The array 100 of pixels 10 of image sensor 2 is arranged inside and on top of the first region 40a of the substrate 40 of image sensor 2.

Substrate 40 and first region 40a are, for example, formed in a semiconductor material, which may be identical or different between first region 40a and the rest of substrate 40.

First region 40a is electrically insulated from the rest of substrate 40. It is thus possible for a different electric potential to exist at the level of first region 40a and at the level of the rest of substrate 40.

In the example illustrated in FIG. 3B, to obtain the electric insulation of first region 40a from the rest of substrate 40, insulation structures or trenches 40b surround each pixel 10 individually. Insulation structures 40b may also entirely surround pixel array 100. Insulation trenches 40b cross substrate 40 across its entire thickness to ensure the electrical insulation.

In an example, structures 40b are capacitive deep trench insulation structures and correspond to trenches filled with a conductive material insulated from the substrate by an electrically-insulating layer. In other examples, not illustrated, these structures are deep trench insulation, DTI, structures, corresponding to trenches entirely filled with insulator.

The control circuit 20 of image sensor 2 enables to apply to first region 40a, during the integration phase, electric potential Vpixsub1, which is, for example, positive with respect to the potential (GND) of substrate 40.

During the readout phase, the control circuit 20 of image sensor 2 enables to apply, to first region 40a, electric potential Vpixsub2, for example equal to the potential GND of substrate 40.

Figure 4:
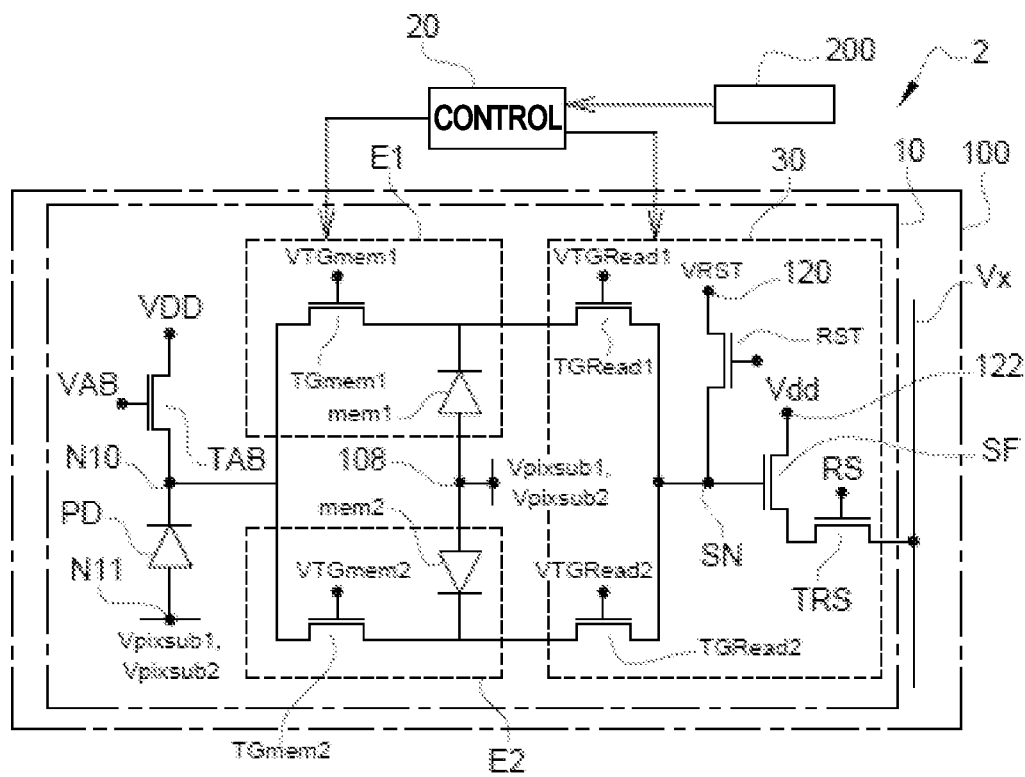
FIG. 4 schematically shows an example of a pixel in an image sensor according to an embodiment of the present description.

FIG. 4 schematically shows the circuit of the image sensor 2 of FIG. 1. More particularly, FIG. 4 shows an example of the pixel 10 of image sensor 2 in the case of a pixel of indirect time of flight type.

Image sensor 2 comprises an array 100 of pixels 10, one of which is illustrated in FIG. 4, and control circuit 20.

In the embodiment illustrated in FIG. 4, each pixel 10 of the array comprises a photoconversion area (PD), for example, a photodiode, preferably a pinned photodiode. Electrons are accumulated on the cathode of the photodiode and the photogenerated holes are discharged towards the substrate.

In the shown example where the useful photogenerated charges, that is, those which have accumulated in first area PD, are electrons, the anode of photodiode PD is arranged in contact with a node N11 of application of a potential Vpixsub1, or of a potential Vpixsub2, in a local portion of the substrate at the level of the pixels.

Pixel 10 comprises at least two identical circuit assemblies, for example two assemblies E1 and E2 in the example of FIG. 4 where these assemblies E1 and E2 are delimited by dotted lines. Each assembly E1, E2 comprises a memory area, called second area (mem1, mem2) and a transfer gate (TGmem1, TGmem2) coupling the memory area of the assembly to the cathode of the photodiode. For example, in assembly E1, respectively E2, transfer gate TGmem1, respectively TGmem2, is configured to transfer the charges between the cathode of the photodiode and memory area mem1, respectively mem2.

In the example of FIG. 4, each memory area mem1, mem2 is implemented by a pinned diode. In each assembly E1, E2, memory area mem1, mem2 is configured to store the charges. Transfer gates TGmem1, TGmem2 enable to transfer the charges between photodiode PD and memories mem1, mem2. The anodes of the diodes of memories mem1, mem2 are connected to a node 108 of application of potentials Vpixsub1 and Vpixsub2.

Each transfer gate TGmem1, TGmem2 receives, for example from control circuit 20, a control signal (VTGmem1, VTGmem2) formed either of a control potential VTGmemHI1, VTGmemHI2, or of a control potential VTGmemLO1, VTGmemLO2.

Transfer gate TGmem1, TGmem2 is, for example, formed to be set to the on state when potential VTGmemHI1, VTGmemHI2 is applied thereto.

Transfer gate TGmem1, TGmem2 is for example further formed to be set to the off state when potential VTGmemLO1, VTGmemLO2 is applied thereto.

In the example illustrated in FIG. 4, pixel 10 comprises an anti-blooming device (TAB). Device TAB is, for example, a transistor receiving a potential (VAB) on its gate. Device TAB is connected between the cathode of photodiode PD and a node of application of the power supply potential VDD of pixel 10.

In the example of FIG. 4, pixel 10 further comprises a second circuit 30 (delimited by dotted lines in FIG. 4). Second circuit 30 couples the assemblies E1, E2 of pixel 10 to one or a plurality of conductive lines Vx, for example shared by all the pixels of a same column of a pixel array. In the example of FIG. 4, second circuit 30 is connected to a single line Vx. Second circuit 30 is configured, when pixel 10 is selected during a second readout phase, for example, when all the pixels of a same row of a pixel array are selected, to deliver signals representative of the state of the memory areas mem1, mem2 of the pixel, onto the line(s) Vx having second circuit 30 connected thereto. These signals are, for example, representative of the number of charges transferred from area PD to each of areas mem1 and mem2 during an integration phase preceding the readout phase.

Second circuit 30 further comprises a transfer device, for example, a transfer gate TGread1, TGread2, driven by control circuit 20 and configured to allowing a transfer of the charges stored at the level of areas mem1, mem2.

Transfer gate TGread1, respectively TGread2, is configured to transfer charges between memory area mem1, respectively mem2, and a sense node SN of circuit 30.

Transfer gate TGread1, respectively TGread2, receives a control signal VTGread1, respectively VTGread2. As an example, a potential VTGreadLO1, respectively VTGreadLO2 blocks transfer gate TGRead1, respectively TGread2, so that node SN is then electrically insulated from memory areas mem1, mem2. A potential VTGReadHI1, VTGReadHI2, of signal VTGread1, respectively VTGread2, makes transfer gate TGread1, TGread2 conductive so that the potential of node SN is then determined by the number of charges which were previously in memory area mem1, respectively mem2. Potentials VTGReadHI1 and VTGReadHI2 are for example identical. Similarly, potentials VTGreadLO1 and VTGreadLO2 are identical.

In the example of FIG. 4, second circuit 30 further comprises a transistor RST. Transistor RST is connected between node SN and node 120 of application of a reset potential VRST, for example, equal to potential VDD. Transistor RST receives a control signal RST. As an example, a potential RSTHI of signal RST turns on transistor RST, for example, to reset node SN to potential VRST, and a potential of signal RST (RSTLO) turns off transistor RST so that node SN is then electrically insulated from node 120.

In the example of FIG. 4, second circuit 30 also comprises a transistor TRS connected between conductive line Vx and a source of a transistor SF of second circuit 30.

Transistor SF has its gate coupled, for example, connected, to node SN, its source coupled, for example connected, to transistor TRS, and its drain coupled, for example connected, to a node 122 of application of a potential, for example, potential VDD.

Transistor TRS receives on its gate a control signal RS. As an example, a first level or state of signal RS turns on transistor TRS and a current source (not illustrated in FIG. 4) coupled to line Vx is activated, so that transistor SF operates as a source follower and the potential on line Vx is then determined by that of node SN. A second level of signal RS turns on transistor TRS, so that the potential on line Vx is independent from that of node SN.

During a phase of integration of the light reflected by a scene to be captured, each control signal VTGmem1, VTGmem2 is periodically switched between potential VTGmemHI1, VTGmemHI2 and potential VTGmemLO1, VTGmemLO2 respectively. Potentials VTGmemHI1 and VTGmemHI2 are, for example, identical. Similarly, potentials VTGmemLO1 and VTGmemLO2 are, for example, identical. When the first gate is conductive, the photogenerated charges accumulated in area PD are transferred to the memory area associated with this transfer gate. For example, when the control signal VTGmem1, respectively VTGmem2, applied to gate TGmem1, respectively TGmem2, is at potential VTGmemHI1, VTGmemHI2, the charges accumulated in area PD are attracted under the gate, after which the switching of the control signal to potential VTGmemLO1, VTGmemLO2 causes the transfer of these charges to memory area mem1, respectively mem2.

In an example, the integration phase comprises a plurality of charge transfer phases.

The frequency at which each of the transfer gates TGmem1 and TGmem2 is alternately set to the non-conductive state (no charge transfer from area PD to the corresponding memory area mem1 or mem2) and to the conductive state (charge transfer from area PD to the corresponding memory area mem1 or mem2) is, for example, greater than 50 MHz, preferably in the order of one or several hundreds of MHz. The necessary supply power increases with this frequency. The levels of signals VTGmem1, VTGmem2 are, for example, generated like the level of the above-described voltage VTRSF, and the generation of these signals thus does not require using a positive power supply alternating with a negative power supply.

Control signals VTGmem1 and VTGmem2 are configured so that the charges accumulated in area PD are alternately transferred to each of the memory areas of pixel 10, as well known by those skilled in the art. In particular, it is known by those skilled in the art that control signals VTGmem1 and VTGmem2 are phase-shifted and are configured so that no charge transfer to one of memory areas mem1 or mem2 occurs at the same time as a charge transfer to the other one of these areas mem1 and mem2. In an example, control signal VTGmem1 is in a high state only when control signal VTGmem2 is in a low state, and control signal VTGmem2 is in a high state only when control signal VTGmem1 is in a low state. In an additional example, the pulse of each control signal VTGmem1 and VTGmem2 is of same width.

In an example, the value of potential Vpixsub1 is determined so that transfer gate TGmem1, TGmem2 is non-conductive when potential Vpixsub1 is locally applied to the substrate at the level of pixels 10 and the gate is at potential VTGmemLO1, VTGmemLO2.

As an example, potential Vpixsub1 is positive and smaller than 1.5 V and, for example, equal to approximately 0.3 V. Potential Vpixsub1 is applied to the entire substrate of pixel 10, and thus forms the substrate voltage of transfer gate TGmem1, TGmem2. Transfer gate TGmem1, TGmem2 then becomes non-conductive when it receives a control potential equal to ground GND. Transfer gate TGmem1, TGmem2 is conductive when it receives a control potential greater than a positive threshold value.

In an example, control circuit 20 comprises a voltage regulator, or a voltage source, configured to deliver voltage Vpixsub1. Preferably, control circuit 20 is referenced to ground GND by a direct connection.

In an example illustrated in the following table 1 (Table 1), control circuit 20, lowers, between the integration phase (INTEGRATION) and the readout phase (READOUT), potential VTGmemLO1, VTGmemLO2, by the value of potential Vpixsub1. An advantage of this implementation is that, even if the substrate at the level of pixels 10 is locally at potential 0 V, in other words at ground GND, then potential VTGmemLO1, VTGmemLO2 remains smaller than this potential. This enables to ascertain that gate TGmem1, TGmem2 is effectively robustly in the non-conductive state during the readout phase.

TABLE 1

|  | I | R |
|---|---|---|
| Pixel substrate | +Vpixsub1(V) | Vpixsub2(V) = 0 V |
| VTGmemLO1, VTGmemLO2 | 0(V) | 0(V)-Vpixsub1(V) |

An advantage linked to the fact that potentials VTGmemLO1, VTGmemLO2 are at ground during the integration phase is that it is not necessary to generate a negative voltage.

During the readout phase, although potentials VTGmemLO1, VTGmemLO2 are negative, the power to be supplied by the power supply at the level of gates TGmem1, respectively TGmem2 is low or even zero since in readout phase, there is no switching of the gates and thus no current is consumed.

Taking this fact into account, according to an example, during the readout phase, potential VTGmemLO1, VTGmemLO2 is capacitively applied.

In an example that may be combined with the previous ones, particularly the examples of Table 1, control circuit 20 lowers, between the integration phase and the readout phase, potential VTGReadLO1, VTGReadLO2, by the value of potential Vpixsub1. This enables to ascertain that potential VTGReadLO1, VTGReadLO2 effectively follows the local biasing of the substrate at the level of pixels 10, that is, the relative voltages are preserved at the level of pixels 10. The potential variation is noted in a Table 2 in combination with the example of Table 1.

TABLE 2

|  | I | R |
|---|---|---|
| Pixel substrate | +Vpixsub1(V) | Vpixsub2 (V) = 0 V |
| VTGmemLO1, VTGmemLO2 | 0(V) | 0(V)-Vpixsub1(V) |
| VTGReadLO1, VTGReadLO2 | −1(V) | −1(V)-Vpixsub1(V) |

In an example that may be combined with the examples of Tables 1 and 2, control circuit 20 lowers, by the value of potential Vpixsub1, between the integration phase and the readout phase, potential VTGReadHI1, VTGReadHI2. This enables for the relative voltages to be preserved at the level of pixels 10.

The control potentials RSTHI, RSTLO of first transistor RST may also be optionally lowered by the value of potential Vpixsub1, between the integration phase and the readout phase. This enables for the relative voltages to be preserved at the level of pixels 10. Table 3 shows this case.

TABLE 3

|  | I | R |
|---|---|---|
| Pixel substrate | +Vpixsub1(V) | Vpixsub2 (V) = 0 V |
| VTGmemLO1, VTGmemLO2 | 0(V) | 0(V)-V pixsub1(V) |
| VTGReadLO1, VTGReadLO2 | −1(V) | −1(V)-Vpixsub1(V) |
| VTGReadHI1, VTGReadHI2 | +2.8 (V) | +2.8 (V)-Vpixsub1(V) |
| RSTHI | +3.6 (V) | +3.6 (V)-Vpixsub1(V) |
| RSTLO | +1.3 (V) | +1.3 (V)-Vpixsub1(V) |

Figure 5:
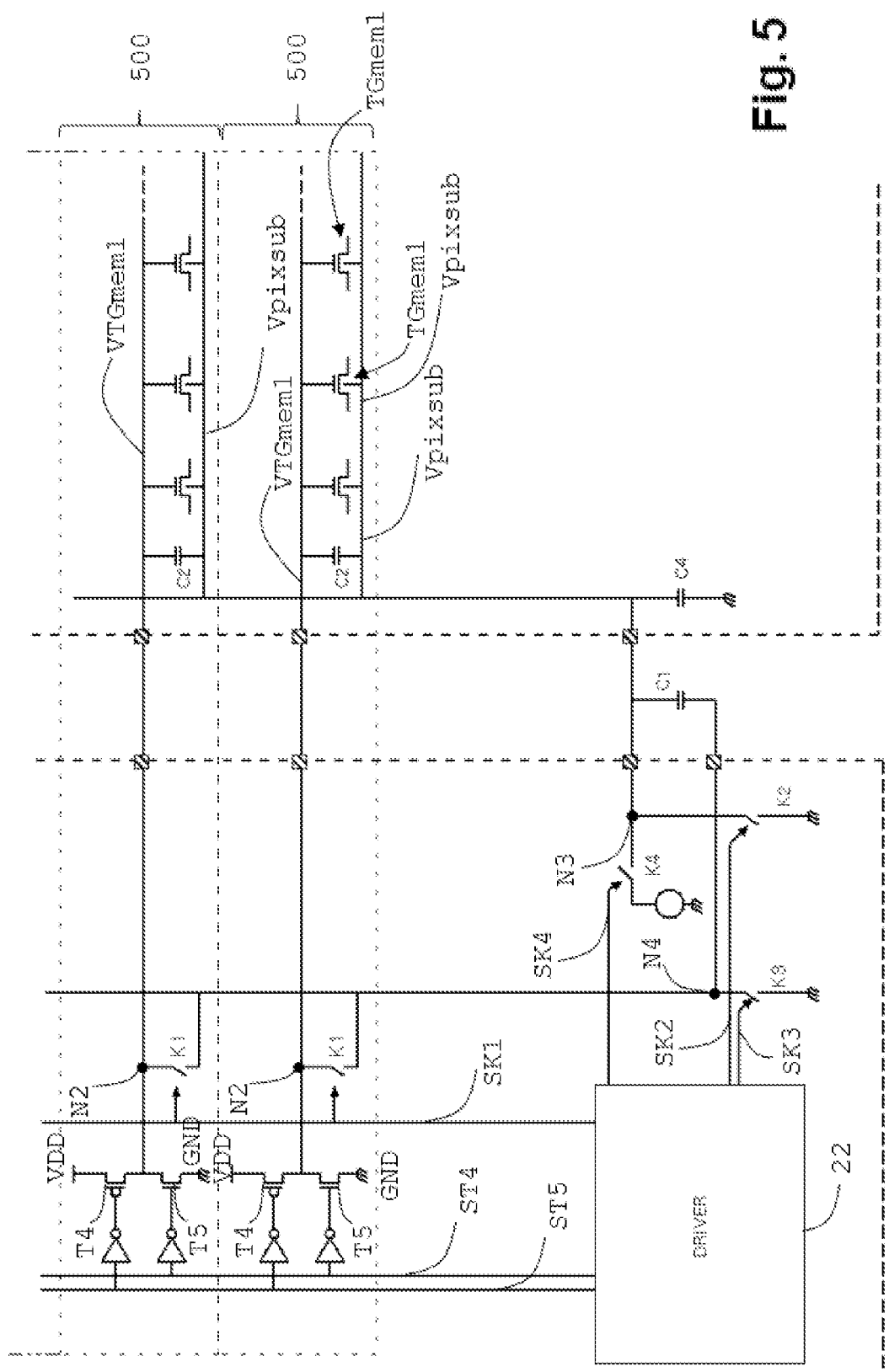
FIG. 5 schematically shows a control circuit of the image sensor of FIGS. 1 and 4 according to an embodiment of the present description.

In the example of FIGS. 4 and 5, the transfer gates, the switches, and the transistors are preferably of MOS type.

FIG. 5 schematically shows the control circuit 20 of the image sensor of FIGS. 1 and 4 according to an embodiment of the present description. The example of FIG. 5 is based on the case where, during the readout phase, the power to be supplied by the power supply at the level of gates TGmem1, respectively TGmem2, is preferably zero.

FIG. 5 shows, in particular, the portion of control circuit 20 configured to generate the voltage VTGmem1 applied to the transfer gates TGmem1 of pixels comprised in pixel columns 500 (the pixels are not entirely shown, only the transistors TGmem1 of certain pixels being shown). Control circuit 20 is also configured to generate the potential Vpixsub applied to the substrate of the pixels of pixel columns 500 and particularly to the substrate nodes of transfer gates TGmem1. FIG. 5 shows an example with two pixel columns 500, although in practice, there may be several hundreds or thousands of columns 500 powered by control circuit 20.

There exists, for example, in each pixel column 500, a stray capacitance C2 present between transfer gates TGmem1 and the substrate nodes of these transfer gates TGmem1 (corresponding to substrate region 40a). Further, there exists a capacitive element C4 between the substrate nodes of the transfer gates TGmem1 of all the pixel columns 500 and the rest of the substrate (corresponding to general substrate 40). Although this is not illustrated in FIG. 5, control circuit 20, for example, further comprises a similar circuit to generate the voltage VTGmem2 applied to the gates of the transistors TGmem2 of the pixels of pixel columns 500.

Circuit 20 comprises, in each pixel column 500, a pair of transistors T4 and T5 series-coupled between power supply rail VDD and ground potential rail GND. Transistor T4 is, for example, a PMOS transistor, and transistor T5 is, for example, an NMOS transistor, and they are, for example, series-coupled by their drains. An intermediate node N2 between transistors T4 and T5 is coupled, for example, connected, to the transfer gates TGmem1 of the pixels of the corresponding pixel column 500, and delivers voltage VTGmem1. Transistors T4 and T5 are controlled independently from each other. For example, control circuit 20 comprises a driver circuit (DRIVER) 22 configured to generate signals ST4 and ST5 to drive the gates of the transistors T4 and T5 respectively of each column, for example, via inverters.

Control circuit 20 further comprises, in each column, a switch K1 coupling node N2 to a node N4. Control circuit 20 also comprises a switch K3 coupling node N4 to ground potential rail GND, and a switch K2 connected between a node N3 and ground potential rail GND. Node N3 is coupled, for example, connected, to the substrate nodes of the pixels of each pixel column, and in particular to the substrate nodes of transistors TGmem1, and delivers potential Vpixsub. Node N3 is also coupled by a switch K4 to a voltage source 21, which is, for example, coupled to ground. Voltage source 21 is configured to generate potential Vpixsub1, equal for example to approximately 300 mV. A capacitive element C1 is, for example, connected between node N3 and node N4. This capacitive element C1 is, for example, formed by a capacitor external to control circuit 20. Switches K1, K2, K3, and K4 are, for example, controlled by respective control signals SK1, SK2, SK3, and SK4, these signals being, for example, generated by driver circuit 22. Switches K1, K2, K3, K4 are, for example, formed by transistors, for example, of MOS type.

During the phase of integration of the pixels of pixel columns 500, switches K1 and K2 are, for example, in the off state, and switches K3 and K4 are, for example, in the on state, so that node N3, and thus potential Vpixsub, are at level Vpixsub1. Inside of each pixel column 500, transistors T4 and T5 are alternately driven to activate and deactivate transfer gates TGmem1.

To pass to the readout phase, switches K1 to K4 are controlled so that potential Vpixsub is decreased, for example, to 0 V, and voltage VTGmem1 is decreased, for example, to −300 mV, as will now be explained in further detail in reference to FIG. 6.

Figure 6:
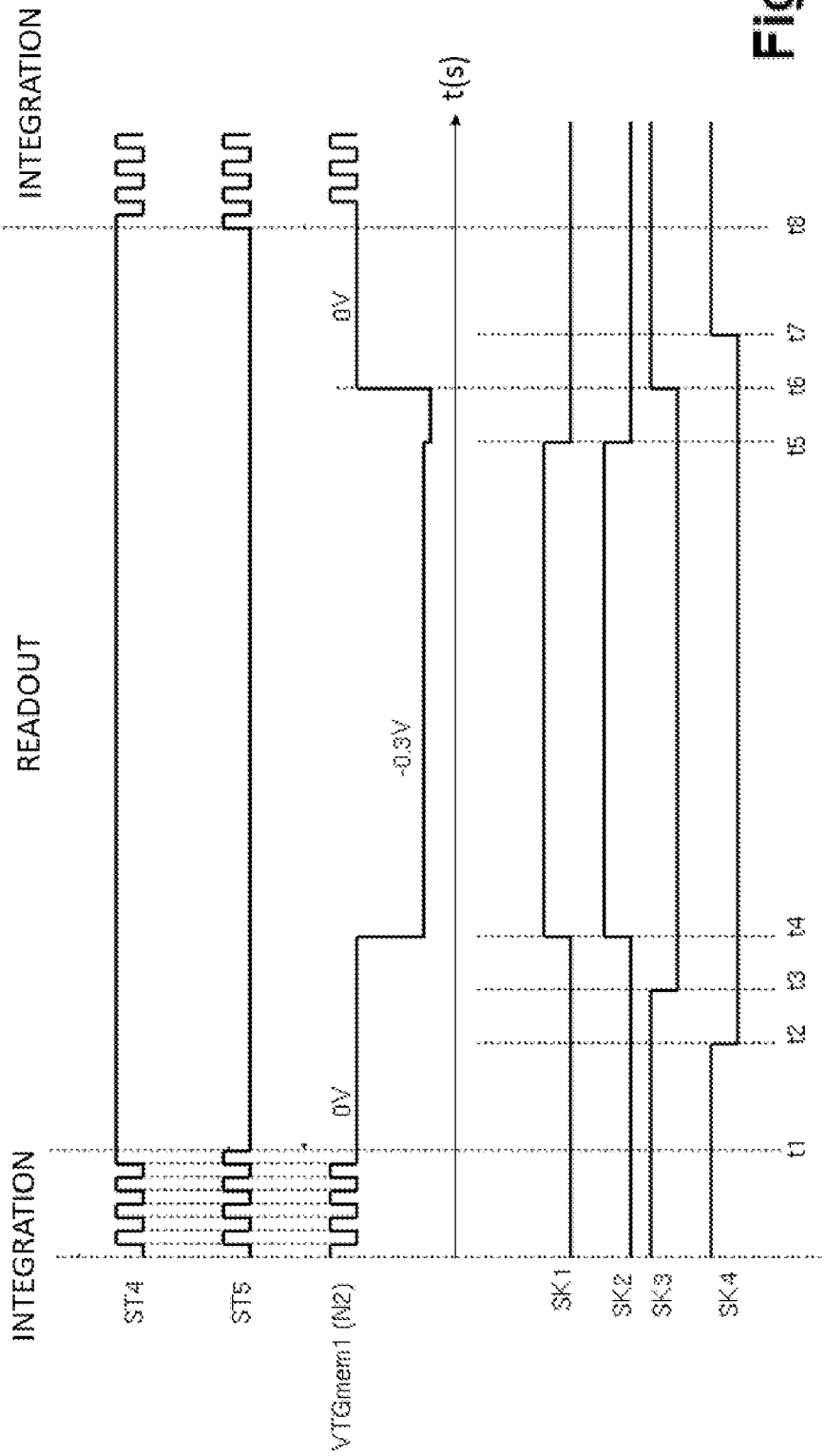
FIG. 6 is a timing diagram showing an example of the signals in the control circuit of FIG. 5.

FIG. 6 is a timing diagram showing an example of the signals in the control circuit 20 of FIG. 5. FIG. 6 shows in particular an example of voltage signal VTGmem1 according to activation of transistors T4 and T5 by control signals ST4 and ST5, and of switches K1, K2, K3, K4 by control signals SK1, SK2, SK3, and SK4. By convention, the state of the switches described in relation with FIG. 6 is in the on state when the control signal is in the high state, although the inverse may also be done in practice.

FIG. 6 illustrates a few switching cycles of transistors T4 and T5 during a last portion of the integration phase. At the end of the integration phase, signals ST4 and ST5 are at the high level so that output VTGmem1 is at the low level, signals SK1 and SK2 are, for example, at the low level, so that switches K1 and K2 are in the non-conductive state, and signals SK3 and SK4 are, for example, in the high state, so that switches K3 and K4 are in the conductive state. Transistors T4 and T5 are alternately driven to activate and deactivate transfer gates TGmem1.

On passing from the integration phase to the readout phase, transistors T4 and T5 are driven independently, at time t1 in FIG. 6, to both be in a non-conductive state by respectively setting the voltage ST4 at the gate of transistor T4 to the high state and the voltage ST5 at the gate of transistor T5 to the low state. In other words, the power stage formed by transistors T4 and T5 has to be set to a high impedance state.

Then, at a time t2 after time t1, signal SK4 is taken to the low state, to sample a voltage equal to Vpixsub1 across capacitive element C1.

Then, at a time t3 after time t2, signal SK3 is taken to the low state to make capacitive element C1 floating.

Then, at a time t4 after time t3, signals SK1 and SK2 are taken to the high state one after the other or simultaneously, so that node N3 is at ground (0 V), and voltage VTGmem1 becomes negative by approximately the voltage level delivered by voltage source 21. For example, if the voltage level delivered by voltage source 21 is approximately 300 mV, voltage VTGmem1 becomes equal to approximately −300 mV. The readout phase can then start, during which transistors T4 and T5 remain in the off state.

Between the integration and readout phases, the potential generated by voltage source 21 is sampled from capacitor C1 by the turning off of switch K4. Capacitor C1 maintains the negative value of potential VTGmemLO during the readout phase. For this purpose, the value of C1 is relatively high, for example, of a plurality of μF according to the size of the pixel array.

At the end of the readout phase, a new integration phase may be started by a sequence inverse to that applied between times t1 to t4. In particular, at a time t5, signals SK1 and SK2 are taken to the low state one after the other or simultaneously. Then, at a time t6 after time t5, signal SK3 is taken to the high state. At a time t7 after time t6, signal SK4 is taken to the high state. From a time t8 after time t7, the integration phase starts, and transistors T4 and T5 are alternately driven to activate and deactivate transfer gates TGmem1.

A finite state machine is, for example, used to implement the different potential, current, or voltage changes, according to the different phases via, for example, the different involved electronic circuits.

Various embodiments and variants have been described. Those skilled in the art will understand that certain features of these various embodiments and variants may be combined, and other variants will occur to those skilled in the art. Further, although embodiments and variants where each memory area is a pinned diode have been described, it will be within the abilities of those skilled in the art to adapt these embodiments and variants to the case where each memory area is a capacitive element, for example, by modifying circuit 30.

Further, the described embodiments and variants are not limited to the example of circuit 30 described in relation with FIG. 4. It will be within the abilities of those skilled in the art to provide other output circuits of pixel 10, for example, a circuit 30 comprising a first sense node SN associated with memory area mem1 and coupled to a first line Vx by a first assembly of a transistor SF assembled as a source follower and of a selection transistor TRS, and a second sense node SN associated with memory area mem2 and coupled to a second line Vx by a second assembly of a transistor SF assembled as a source follower and of a selection transistor TRS.

Finally, the practical implementation of the described embodiments and variations is within the abilities of those skilled in the art based on the functional indications given hereabove, in particular, as for the capacitive application of potentials.

The invention claimed is:

1. An image sensor, comprising:
an array of pixels inside and on top of a substrate; and
a control circuit configured to:
apply a first potential at ground to the substrate during a first phase of pixel operation for reading charge from the pixel; and
apply a second potential to the substrate that is positive with respect to the first potential during a second phase of pixel operation for integrating charge in the pixel;
wherein each pixel comprises:
a first area configured to generate charge in response to a luminous excitation; and
at least two circuit assemblies, wherein each circuit assembly comprises:
a second area configured to storing charge generated by the first area; and a first transfer gate configured to controlling a transfer of the charge from the first area to the second area;
wherein the control circuit is configured to control, for each transfer gate of each circuit assembly of each pixel:
a setting of the first transfer gate to a conductive state by applying a third potential, and
a setting of the first transfer gate to a non-conductive state by applying a fourth potential smaller than the third potential:
wherein the second potential is controlled so that the first transfer gate is non-conductive when the second potential is applied to the substrate and the fourth potential is applied to the first transfer gate, the fourth potential being equal to or smaller than a potential of the substrate.

2. The image sensor according to claim 1, wherein the control circuit is configured to lower the fourth potential between the second phase and the first phase.

3. The image sensor according to claim 1:
wherein charge integrated in the second phase by the first area are transferred and stored in at least one of said second areas; and
wherein charge read in the first phase corresponds to reading a state representative of the charge stored at the second areas.

4. The image sensor according to claim 1, wherein the image sensor is of indirect time of flight type.

5. An image sensor comprising:
an array of pixels inside and on top of a substrate; and
a control circuit configured to:
apply a first potential at ground to the substrate during a first phase of pixel operation for reading charge from the pixel; and
apply a second potential to the substrate that is positive with respect to the first potential during a second phase of pixel operation for integrating charge in the pixel;
wherein each pixel comprises:
a first area configured to generate charge in response to a luminous excitation; and
at least two circuit assemblies, wherein each circuit assembly comprises:
a second area configured to storing charge generated by the first area; and
a first transfer gate configured to controlling a transfer of the charge from the first area to the second area;
wherein each pixel comprises a second circuit coupling the at least two circuit assemblies to at least one conductive line, the second circuit comprising a second transfer gate driven by the control circuit and configured to transfer charge stored at the second area towards a sense node; and
wherein the control circuit is configured to lower a fifth potential applied to the second transfer gate by a value of the second potential between the second phase and the first phase.

6. The image sensor according to claim 5, wherein the second circuit comprises:
a first transistor having its drain coupled to the sense node;
a second transistor having a control gate coupled to the sense node; and
a third transistor connected between the conductive line and a source of the second transistor;
wherein the control circuit is configured to lower, between the second phase and the first phase:
a sixth potential applied to the second transfer gate by the value of the second potential; and
a seventh potential and an eighth potential for controlling the first transistor by the value of the second potential.

7. An image sensor comprising:
an array of pixels inside and on top of a substrate; and
a control circuit configured to:
apply a first potential at ground to the substrate during a first phase of pixel operation for reading charge from the pixel; and
apply a second potential to the substrate that is positive with respect to the first potential during a second phase of pixel operation for integrating charge in the pixel;
wherein each pixel comprises:
a first area configured to generate charge in response to a luminous excitation; and
at least two circuit assemblies, wherein each circuit assembly comprises:
a second area configured to storing charge generated by the first area; and
a first transfer gate configured to controlling a transfer of the charge from the first area to the second area;
wherein the control circuit comprises:
a fourth transistor controlled independently of a fifth transistor;
wherein a drain of the fourth transistor is coupled to a drain of the fifth transistor at a second node;
wherein a source of the fourth transistor is further coupled to a power supply voltage rail;
wherein a source of the fifth transistor is further coupled to ground;
a first switch connected between the second node and a fourth node;
a second switch connected between the ground and the fourth node;
a second capacitive element connected between a third node and the fourth node;
a voltage source configured to delivering the second potential;
wherein the voltage source is connected between the ground and a third switch, said third switch being connected between the voltage source and the third node; and
a fourth switch connected between the ground and the third node;
wherein the first transfer gate is coupled to the second node.

8. The image sensor according to claim 7, wherein between the second phase and the first phase:
the fourth transistor and the fifth transistor are driven so that the fourth transistor is in a non-conductive state and the fifth transistor is in a conductive state;
then the fourth transistor and the fifth transistor are driven independently to be in a non-conductive state;
then the third switch is set to a non-conductive state;
then the second switch is set to a non-conductive state; and
then the first and fourth switches are set to a conductive state.

9. The image sensor according to claim 8, wherein the first phase and the second phase are alternated in time, and wherein, between the first phase and the second phase:
the first and fourth switches are set to a non-conductive state;
then the second switch is set to a conductive state;

then the third switch is set to a conductive state; and
then the fourth transistor and the fifth transistor are driven to be alternately conductive.

10. An image sensor, comprising:
   a matrix of pixels in and on a substrate, each pixel comprising a first zone configured to generate charge from light excitation and a memory zone configured to store charges generated by the first zone; and
   a control circuit configured to:
      apply a first potential at ground to the substrate during a first phase and control during the first phase turn off of a transistor for transferring charges to the memory zone with a control signal at a first voltage lower than ground; and
      apply a second potential to the substrate that is positive with respect to the first potential during a second phase and control during the second phase turn off of the transistor for transferring charges to the memory zone with the control signal at a second voltage at ground;
   wherein the second phase is an integration phase during which charge generated by the first zone of each pixel is transferred and stored in the memory zone of said pixel; and
   wherein the first phase is a read phase during which a state representative of the charge stored at the memory zone is read from the pixel.

11. The image sensor according to claim 10, in which each pixel comprises:
   at least two circuit assemblies, wherein each circuit assembly comprises:
      the memory zone; and
      said transistor for transferring charges configured to control transfer of charge from the first zone and the memory zone.

12. A method of controlling an image sensor, wherein the image sensor comprises a matrix of pixels in and on a substrate, each pixel comprising a first zone configured to generate charge from light excitation and a memory zone configured to store charges generated by the first zone, the method comprising:
   applying a first potential at ground to the substrate during a first phase and controlling during the first phase turn off of a transistor for transferring charges to the memory zone with a control signal at a first voltage lower than ground; and
   applying a second potential to the substrate that is positive with respect to the first potential during a second phase and controlling during the second phase turn off of the transistor for transferring charges to the memory zone with the control signal at a second voltage at ground;
   wherein the second phase is an integration phase during which charge generated by the first zone of each pixel is transferred and stored in the memory zone of said pixel; and
   wherein the first phase is a read phase during which a state representative of the charge stored at the memory zone is read from the pixel.

* * * * *